United States Patent [19]

Riordan

[11] Patent Number: 5,170,392
[45] Date of Patent: Dec. 8, 1992

[54] INTERMODULATION COMPENSATION IN A RECEIVER

[75] Inventor: Kenneth B. Riordan, Wauconda, Ill.

[73] Assignee: Motorola, Inc., Schaumburg, Ill.

[21] Appl. No.: 642,102

[22] Filed: Jan. 16, 1991

[51] Int. Cl.⁵ .......................... H04J 1/16; H04B 1/06; H04B 7/204
[52] U.S. Cl. ..................................... 370/17; 370/95.3; 455/200.1; 455/234.1; 455/295; 375/98
[58] Field of Search ..................... 370/77, 79, 95.3, 17; 375/98, 99, 103; 455/63, 177, 200, 219, 232, 234, 239, 240, 247, 249, 250, 295, 296, 308, 311, 227, 33, 53, 277, 34, 54; 330/129, 254, 278

[56] References Cited

U.S. PATENT DOCUMENTS

| 4,222,118 | 9/1980 | Dickinson et al. | 455/247 |
| 4,330,859 | 5/1982 | Takada | 370/77 |
| 4,355,414 | 10/1982 | Inoue | 455/177 |
| 5,029,162 | 7/1991 | Epps | 370/77 |

FOREIGN PATENT DOCUMENTS 3613048 10/1987 Fed. Rep. of Germany .

OTHER PUBLICATIONS

"Receiver System Matches Channels from 6 to 18 GHz", Microwaves & RF, Mar. 1989, pp. 127-132—describes a phase-matched receiver having programmable attenuations as shown in FIG. 5, pp. 130-131.

Primary Examiner—Douglas W. Olms
Assistant Examiner—H. Kizou
Attorney, Agent, or Firm—Richard A. Sonnentag; Raymond A. Jenski; Raymond J. Warren

[57] ABSTRACT

A receiver 200 automatically compensates for intermodulation of an input signal. The receiver 200 is preceded by a receiver front-end 105 which is coupled to antennas 100-102 receiving the signal. The gain of the antenna path/frequency is calibrated and stored for all combinations of antenna path/frequency. When a signal is received, the receiver 200 determines the correct stored gain factor representing the antenna receiving the signal and the frequency of the signal. The gain factor is compared against a predetermined threshold, and if the gain factor is greater than the threshold, an attenuator 400 placed at the front of the receiver 200 is inserted to optimize signal intermodulation. If the gain factor less than the threshold, the attenuator 400 is bypassed to optimize the sensitivity of the receiver 200.

30 Claims, 3 Drawing Sheets

INTERMODULATION COMPENSATION IN A RECEIVER

FIELD OF THE INVENTION

This invention relates generally to receivers and more specifically to cellular radiotelephone receivers requiring intermodulation compensation.

BACKGROUND OF THE INVENTION

Land-Mobile Telecommunication systems (e.g., Cellular Radio Telephone), frequently employ base-stations capable of supporting multiple Radio Channel Units (RCUs). Each RCU contains the necessary receiver hardware to support one RF carrier. In order to facilitate a practical base-site antenna system, it is essential that the base-site also contain a Receiver Multicoupler Network (RMN) which permits multiple RCUs to share the same receive antenna or set of antennas. (e.g., Cellular base-sites may have in excess of 100 RCUs).

In order to permit a system operator flexibility in the size and complexity of a particular base-site, it is typically a requirement of the RCU design to function properly in several different RMN configurations. Differences may include the number of available ports, the gain, noise figure, third order intercept point of the network, etc. Additional complexity to the RMN can be introduced if the network is designed to permit switching of multiple antenna inputs to each of the RCUs. (This feature is frequently encountered in Cellular base-sites to facilitate system performance enhancements, such as specific frequency re-use patterns, diversity, etc.)

For any receiver, the sensitivity performance (noise figure) and the intermodulation performance (3rd order intercept point) present opposing requirements on the design of the receiver. High values of gain, particularly in the front-end of the receiver, tend to be beneficial to sensitivity but detrimental to intermodulation (IM) performance. Conversely, moderate to low values of front-end gain produce improved IM performance at the expense of sensitivity.

Simultaneous compliance with both the sensitivity and IM specifications for a given receiver is always an important design consideration, and is often a difficult challenge. Obtaining optimum performance for both parameters in a base-station RCU has several difficulties not had by a mobile design. The complication results from the requirement for the RCU to operate in several different RMN configuration, each of which supports multiple RCUs, and multiple antennas.

The affect of this requirement on sensitivity and IM performance is twofold. First, the high losses associated with the multiple signal splitting stages of the RMN requires corresponding high gain to take over the total noise figure. The composite gain (required to obtain the specified noise figure) of the amplifier stages and the splitting stages is higher than would be required if no splitters were needed. This increased gain is detrimental to IM performance.

The second complication results from the inevitable gain variations of the various RMNs. The requirement for the RCU to operate with multiple receiver front-end configurations brings with it an unavoidable variation in front-end gains. This effect is further extended by the fact that each RMN configuration consists of multiple stages, each with its own gain tolerance as a function of frequency, temperature, and part-to-part variations.

The net affect of the front-end gain variation can be simplified as follows: in order to guarantee that the sensitivity requirement is met at the low end of the gain distribution, the RCU must have excess IM margin to deal with the unavoidable IM degradation at the high end of the gain distribution.

Thus a need exists for a receiver/base-station which optimally compromises between receiver sensitivity and intermodulation performance while maintaining specified receiver performance.

SUMMARY OF THE INVENTION

A receiver compensates for intermodulation of a signal. The receiver has as an input at least one signal having a frequency within a predetermined frequency band, the signal accepted by at least one antenna having frequency related characteristics, the antenna coupled to a modifying network having gain characteristic values related to the frequencies of the frequency band and the antenna having frequency related characteristics. The receiver stores the gain characteristic values, determines which of the gain characteristic values most nearly corresponds to the frequency of the input signal and the antenna having frequency related characteristics and provides at least one gain threshold value. The receiver compensates the input signal when the determined gain characteristic value is greater than the at least one gain threshold.

DETAILED DESCRIPTION OF A PREFERRED EMBODIMENT

Figure 1:
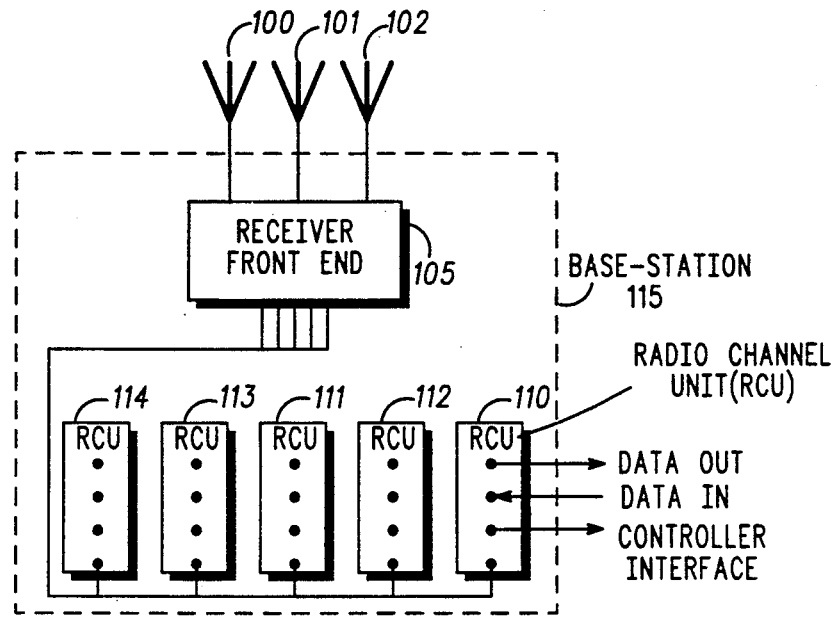
FIG. 1 generally depicts multiple radio channel units employed in a base-station configuration which may incorporate the present invention.

FIG. 1 generally depicts a base-station 115 which may employ the present invention. Three antennas 100–102 are coupled to a modifying network or receiver front-end 105. The number of antennas per base-station 115 may vary from one antenna to six antennas depending on the configuration of the cell-site the base-station 115 is used in. The receiver front-end 105 serves as an interface point between the radio frequency RF signal entering the base-station 115 and any one of a number of receiver modules or radio channel units (RCUs). The RCUs are essentially the radio component of the base-station, serving to receive and transmit signals over antennas 100–102. The RCU's receive data from additional equipment which controls the frequency and antenna path allocation in the TDMA system. They also transmit data to additional equipment to establish/maintain communication to the public telephone system. A controller interface is also available on the RCUs 110–114 for establishing a user interface.

Figure 2:
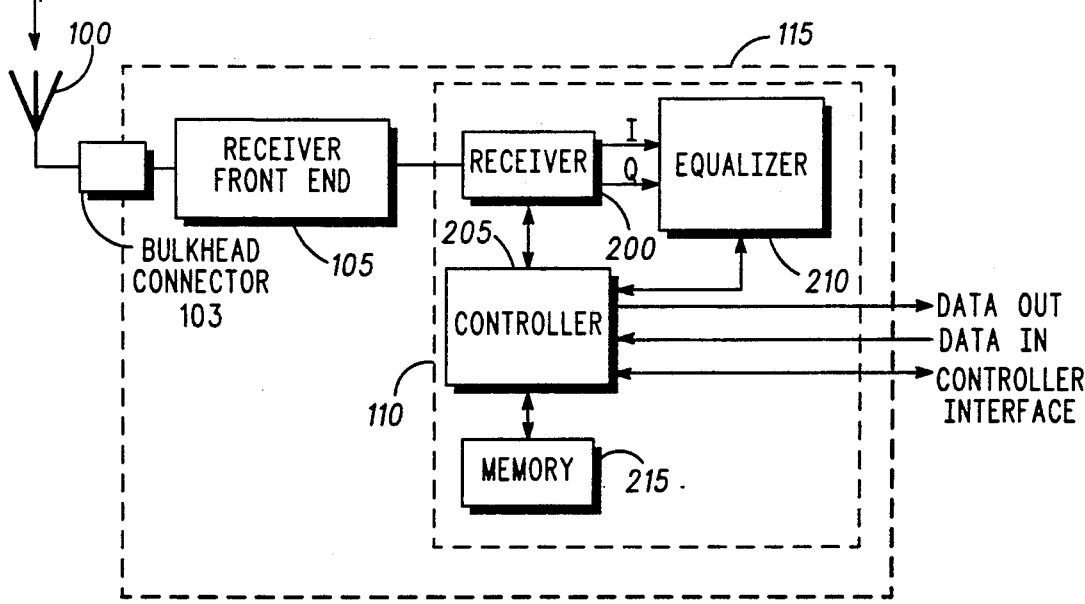
FIG. 2 generally illustrates in block diagram form a base-station employing one radio channel unit in accordance with the present invention.

FIG. 2 logically depicts the base-station 115 which may employ the present invention. In this simplified depiction, only one antenna 100 is shown to be connected to the base-station 115. Again, the base-station 115 may support up to six antennas, depending on the cell-site configuration. Continuing, the antenna 100 is coupled to the receiver front-end 105 through a bulkhead connector 103 which serves as the physical interface point for the antenna 100 to be connected to the base-station 115. Also depicted in FIG. 2 is the receiver portion of one RCU 110; all RCUs 110-114 depicted in FIG. 1 have this same structure. A receiver 200 has as input the signal distributed from the receiver front-end 105, wherein the receiver 200 demodulates the signal into in-phase (I) and quadrature phase (Q) components. The I and Q components from the receiver 200 are input into an equalizer 210 which performs multipath, cross-correlation, and distortion enhancement. The equalizer 210 is coupled to a controller 205 which coordinates all the timing, tuning of frequency synthesizers, allocation of antenna paths, updating/retrieval of gain characteristics values or gain calibration values, etc. within the RCU 110. Also coupled to the controller 205 is a memory device 215, which in the preferred embodiment is a random access memory (RAM) device. The memory 215 stores predetermined calibration values such as signal strength indicators, automatic gain control parameters and antenna path/frequency gain characteristic values, etc.. In the preferred embodiment, the parameters mentioned above are stored in a non-volatile memory device such as a read-only memory (ROM, not shown) and uploaded to RAM for faster operation.

Figure 3:
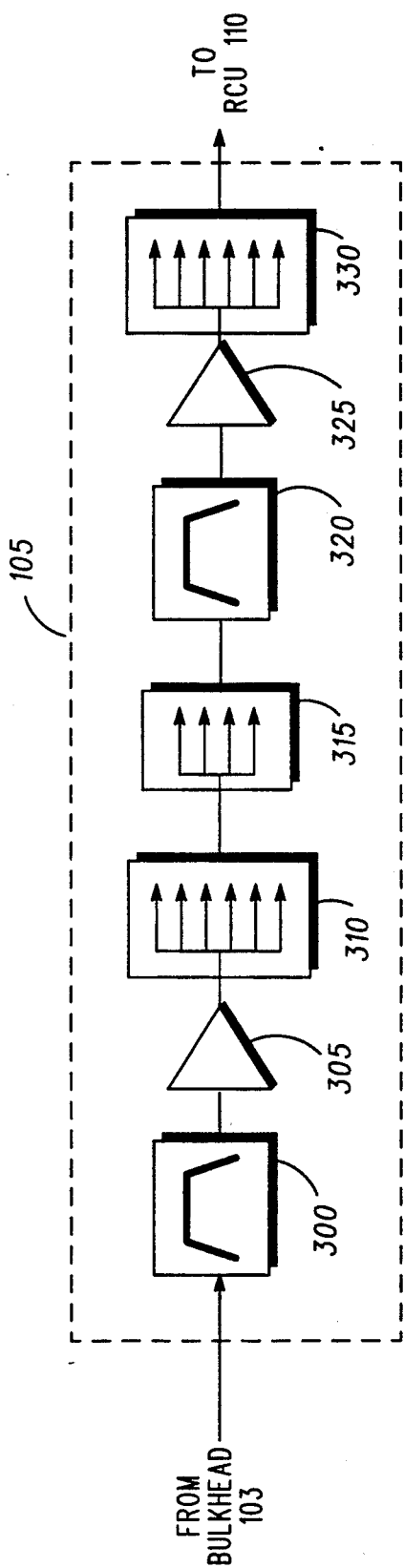
FIG. 3 generally depicts the worst-case gain configuration for a receiver front-end.

FIG. 3 generally depicts a typical receiver front-end 105 configuration. The simplest receiver front-end (105) configuration would support a single antenna, and contains a preselector filter 320, low noise amplifier 325, and a six-way splitter 330 and would yield the smallest amount of front-end gain. The most complex configuration would support all six antennas, and would contain a first preselector filter 300, a first low noise amplifier 305, twenty four-way splitter realized by coupling a six-way splitter 310 to a four-way splitter 315, a second preselector filter 320, a second low noise amplifier 325 followed by a receiver switching matrix (not shown, but replacing the six-way splitter 330) capable of switching any antenna path into any RCU 110-114. The front-end 105 configuration shown in FIG. 3, with the six-way splitter 330 replaced by a switching matrix would yield the largest amount of front-end gain. Although the simplest and most complex front-end configurations are described, other configurations exist depending on the cell-site configuration. Consequently, the gain of the receiver front-end 105 can vary widely from system configuration-to-configuration.

Figure 4:
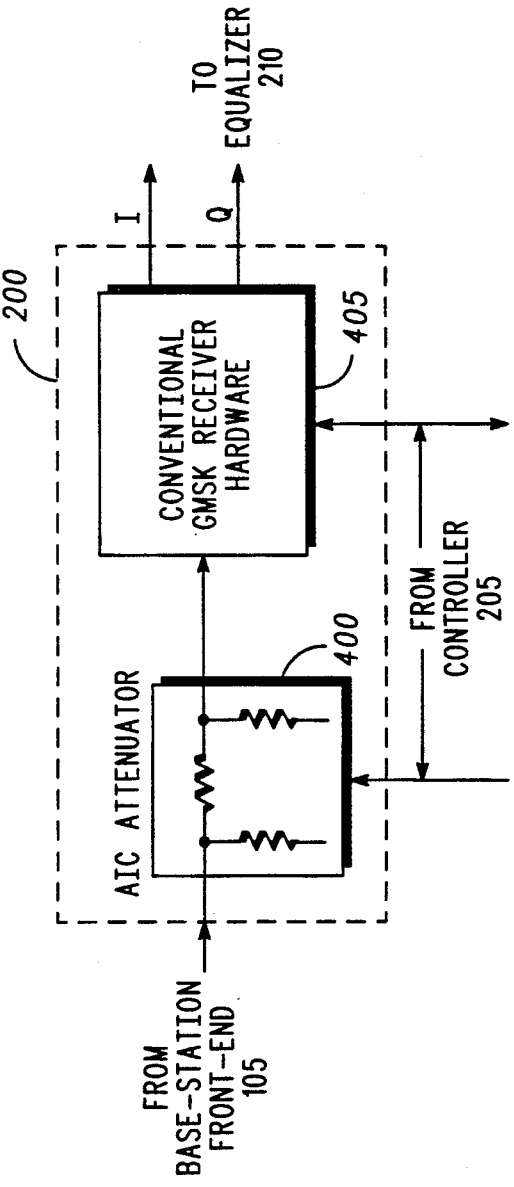
FIG. 4 generally depicts an attenuator located before the receiver in accordance with the invention.

FIG. 4 generally depicts the receiver block 200 in accordance with the invention. A signal distributed by the receiver front-end 105 is input into the receiver 200 where an automatic intermodulation compensation (AIC) attenuator may be inserted or bypassed in accordance with the invention. The AIC attenuator 400 is coupled to conventional GMSK (BT=0.3) receiver hardware 405 which demodulates and converts the input signal into I and Q components, as known in the art. The I and Q components are then sent to the equalizer 210 for further processing. The controller 205 performs the necessary processing to determine when the AIC attenuator 400 is required to be inserted/bypassed.

Figure 5:
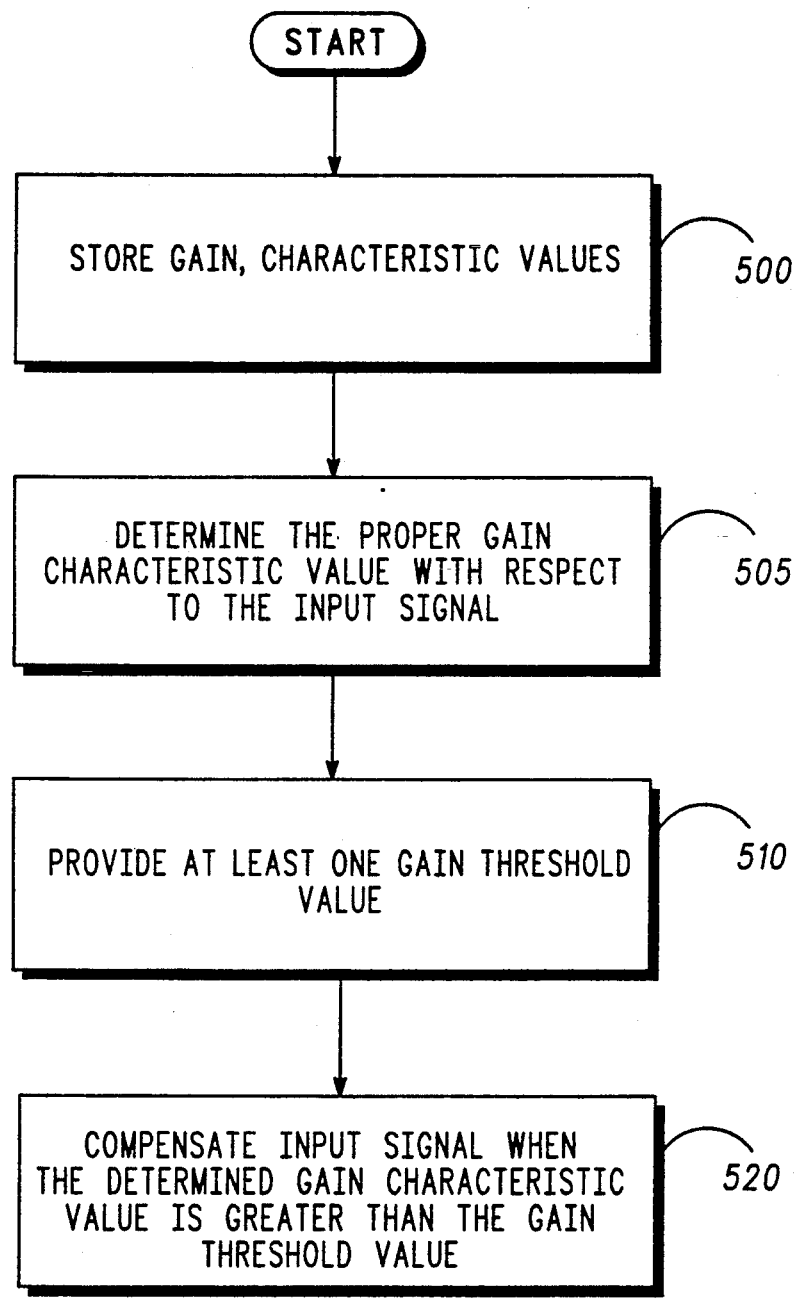
FIG. 5 generally illustrates a flow diagram the steps a RCU performs to compensate intermodulation in accordance with the invention.

FIG. 5 depicts a flow diagram of the steps the RCU performs to compensate for intermodulation of an input signal. The RCU 110 stores at 500 gain characteristic values corresponding to different combinations of antenna path/frequency. The RCU 110 then determines at 505 the gain characteristic value which best represents the frequency of the incoming signal and the antenna that receives the incoming signal. The RCU 110 provides at 510 at least one predetermined gain threshold value, and compensates at 515 the input signal when the determined gain characteristic value is greater than said at least one gain threshold.

As stated earlier, simultaneous compliance with both the receiver sensitivity and the intermodulation (IM) specifications for a given receiver is always an important design consideration and is often a difficult challenge. It can be shown, and is well known to those skilled in the art, that when parameters such as receiver detector sensitivity, noise figure of the front-end 105 and the receiver 200, and intercept point of the front-end 105 and the receiver 200 are taken into account, that the gain of the receiver front-end 105 is inversely related to the intermodulation level, or the receiver's ability to reject interference from two off-frequency signals spaced $\Delta f$ and $2\Delta f$ from the desired signal frequency $f_0$. The complication results from the requirement for RCUs 110-114 to operate in several different receiver front-end 105 configurations, each of which supports multiple RCUs 110-114 and multiple antennas 100-102 and each having a different amount of gain.

The problem of sensitivity versus IM performance is alleviated by an AIC network in accordance with the invention. The AIC network essentially consists of three main parts; the AIC attenuator 400 which again is at the very input of an RCU 110-114, a receiver front-end gain look-up table, and a supervisory algorithm executed by the controller 205 in the RCUs 110-114. Unlike conventional automatic level control (ALC) systems which control the gain of the receiver as the input level changes, the AIC attenuator 400 in the AIC network is controlled according to the gain of the receiver front-end 105 and is independent of input or output level. The receiver front-end 105 gain look-up table is stored in memory 215 and is unique for each RCU 110-114. The table contains gain characteristic values which are values of the receiver front-end 105 gain for every possible combination of received antenna path and received frequency. These values are measured and written to memory 215 of the RCUs 110-114 upon installation of the base-station 115 equipment into a cell-site.

The range of gain control is based upon the range of gains the receiver front-end 105 expects to present to the RCUs 110-114 for different configurations of the receiver front-end 105. The supervisory algorithm executed by the controller 205, which in the preferred embodiment is a Motorola 68030 microprocessor, selects the appropriate gain characteristic value for the particular antenna path/frequency combination that the RCU is using. When the gain of the front-end 105 is high, the AIC attenuator 400 is inserted; when the gain of the front-end 105 is low, the AIC attenuator 400 is bypassed. This selection process is fully dynamic and updates the insertion/bypassing whenever a different frequency or antenna is used by a RCU 110-114. The process is also generic and easily extends to the preferred embodiment, which is a TDMA receiver where the RCUs 110-114 may potentially use different antennas or frequencies for different TDMA timeslots.

For example, upon base-station 115 installation and cell site optimization, the gain of the receiver front-end 105 is characterized or calibrated for each antenna path at 16 frequencies across the predetermined frequency band. The predetermined frequency band, which in the preferred embodiment is 25 MHz, is subdivided into 16 separate frequency groups and the center frequency of each group is used for the calibration. This table of receiver front-end 105 gains is loaded into memory 215 via the controller interface of the controller 205 in each RCU 110-114. During operation, the RCU's controller 205 determines which antenna/frequency combination will be used for the next timeslot and retrieves the associated receiver front-end 105 gain value from the memory 215. The gain value is compared to a gain threshold value, which in the preferred embodiment is 17.5 dB. If the gain value exceeds the threshold, the AIC attenuator 400, which in the preferred embodiment is a 5 dB attenuator, it is automatically inserted at the very input of the RCU. If the gain is below the threshold, the AIC attenuator 400 is bypassed. The insertion or removal of the AIC attenuator 400 is performed every timeslot and specifically during the guard period or set-up period of the timeslots. The result of this process is an effective reduction of the front-end gain distribution presented to the RCUs 110-114 by the receiver front-end 105. In this way, intermodulation of the receiver is not compromised when gain of the front-end 105 is high nor is receiver sensitivity compromised when the gain of the front-end 105 is low.

What is claimed is:

1. A receiver module having compensation for intermodulation of a signal and having as an input at least one signal having a frequency within a predetermined frequency band, said signal accepted by at least one antenna having frequency related characteristics, said antenna coupled to a modifying network having gain characteristic values related to the frequencies of said frequency band and said antenna having frequency related characteristics, the receiver module comprising:
   means for storing the gain characteristic values;
   means for determining which of said gain characteristic values most nearly corresponds to the frequency of said input signal and said antenna having frequency related characteristics;
   means for providing at least one gain threshold value; and
   means for compensating said input signal when said determined gain characteristic value is greater than said at least one gain threshold value.

2. The receiver module of claim 1 wherein said means for compensating further comprises means for attenuating said received signal when said determined gain characteristic value is greater than said at least one gain threshold.

3. The receiver module of claim 2 wherein said means for attenuating further comprises means for providing at least one attenuation value for attenuating said received signal.

4. The receiver module of claim 1 wherein said gain characteristic values can be positive or negative.

5. A fixed site base-station compensation for intermodulation of a signal and having as an input at least one signal having a frequency within a predetermined frequency band, the fixed site base-station comprising:
   at least one antenna having frequency related characteristics for accepting the at least one signal;
   means for storing gain characteristic values related to the frequencies of said frequency band and said antenna having frequency related characteristics;
   means for determining which of said gain characteristic values most nearly corresponds to the frequency of said accepted signal and said antenna;
   means for providing at least one gain threshold value; and
   means for compensating said accepted signal when said determined gain characteristic value is greater than said at least one gain threshold value.

6. The communication system of claim 5 wherein said means for determining further comprises means for subdividing said predetermined frequency band into at least two frequency groups.

7. The communication system of claim 6 wherein said means for determining further comprises means for determining which of said at least two frequency groups contains the frequency of said received signal.

8. The communication system of claim 5 wherein said means for compensating further comprises means for attenuating said received signal when said determined gain characteristic value is greater than said at least one gain threshold.

9. The communication system of claim 8 wherein said means for attenuating further comprises means for providing at least one attenuation value for attenuating said received signal.

10. The communication system of claim 5 wherein said gain characteristic values can be positive or negative.

11. A time-division multiple access (TDMA) communication system having compensation for intermodulation of a signal and employing a receiver module having as an input at least one signal input during at least one TDMA timeslot, said signal having a frequency within a predetermined frequency band, the TDMA communication system comprising:
   at least one antenna having frequency related characteristics for accepting the at least one signal during said TDMA timeslot;
   means for storing gain characteristic values related to the frequencies of said frequency band and said antenna having frequency related characteristics;
   means for determining which of said gain characteristic values most nearly corresponds to the frequency of said accepted at least one signal and said at least one antenna receiving said accepted at least one signal during said at least one TDMA timeslot;
   means for providing at least one gain threshold value during said at least one TDMA timeslot; and
   means for compensating said accepted at least one signal during said at least one TDMA timeslot when said determined gain characteristic value is greater than said at least one gain threshold value.

12. The TDMA communication system of claim 11 wherein said means for determining further comprises means for sub-dividing said predetermined frequency band into at least two frequency groups.

13. The TDMA communication system of claim 12 wherein said means for determining further comprises means for determining which of said at least two frequency groups contains the frequency of said received signal during said at least one TDMA timeslot.

14. The TDMA communication system of claim 11 wherein said means for compensating further comprises means for attenuating said received signal during said at least one TDMA timeslot when said determined gain characteristic value is greater than said at least one gain threshold.

15. The TDMA communication system of claim 14 wherein said means for attenuating further comprises means for providing at least one attenuation value for attenuating said received signal during said at least one TDMA timeslot.

16. The TDMA communication system of claim 11 wherein said gain characteristic values can be positive or negative.

17. A method of compensating intermodulation of a signal in a receiver module having as an input at least one signal having a frequency within a predetermined frequency band, said signal accepted by at least one antenna having frequency related characteristics, said antenna coupled to a modifying network having gain characteristic values related to the frequencies of said frequency band and said antenna having frequency related characteristics, the method comprising the steps of:
   storing the gain characteristic values;
   determining which of said gain characteristic values most nearly corresponds to the frequency of said input signal and said antenna having frequency related characteristics;
   providing at least one gain threshold value; and
   compensating said input signal when said determined gain characteristic value is greater than said at least one gain threshold value.

18. The method of claim 17 wherein said step of compensating further comprises the step of attenuating said received signal when said determined gain characteristic value is greater than said at least one gain threshold.

19. The method of claim 18 wherein said step of attenuating further comprises the step of providing at least one attenuation value for attenuating said received signal.

20. A method of compensating intermodulation of a signal in a fixed site base-station, the fixed-site base-station having as an input at least one signal having a frequency within a predetermined frequency band, the method comprising the steps of:
   accepting the at least one signal on at least one antenna having frequency related characteristics;
   storing gain characteristic values related to the frequencies of said frequency band and said antenna having frequency related characteristics;
   determining which of said gain characteristic values most nearly corresponds to the frequency of said accepted signal and said antenna;
   providing at least one gain threshold value; and
   compensating said accepted signal when said determined gain characteristic value is greater than said at least one gain threshold value.

21. The method of claim 20 wherein said step of determining further comprises the step of sub-dividing said predetermined frequency band into at least two frequency groups.

22. The method of claim 21 wherein said step of determining further comprises the step of determining which of said at least two frequency groups contains the frequency of said received signal.

23. The method of claim 20 wherein said step of compensating further comprises the step of attenuating said received signal when said determined gain characteristic value is greater than said at least one gain threshold.

24. The method of claim 23 wherein said step of attenuating further comprises the step of providing at least one attenuation value for attenuating said received signal.

25. A method of compensating intermodulation of a signal in a time-division multiple access (TDMA) communication system employing a receiver module having as an input at least one signal input during at least one TDMA timeslot, said signal having a frequency within a predetermined frequency band, the method comprising the steps of:
   accepting the at least one signal on at least one antenna having frequency related characteristics during the TDMA timeslot;
   storing gain characteristic values related to the frequencies of said frequency band and said antenna having frequency related characteristics;
   determining which of said gain characteristic values most nearly corresponds to the frequency of said accepted at least one signal and said at least one antenna receiving said accepted at least one signal during said at least one TDMA timeslot;
   providing at least one gain threshold value during said at least one TDMA timeslot; and
   compensating said accepted at least one signal during said at least one TDMA timeslot when said determined gain characteristic value is greater than said at least one gain threshold value.

26. The method of claim 25 wherein said step of determining further comprises the step of sub-dividing said predetermined frequency band into at least two frequency groups.

27. The method of claim 26 wherein said step of determining further comprises the step of determining which of said at least two frequency groups contains the frequency of said received signal during said at least one TDMA timeslot.

28. The method of claim 25 wherein said step of compensating further comprises the step of attenuating said received signal during said at least one TDMA timeslot when said determined gain characteristic value is greater than said at least one gain threshold.

29. The method of claim 28 wherein said step of attenuating further comprises the step of providing at least one attenuation value for attenuating said received signal during said at least one TDMA timeslot.

30. A receiver module for compensating intermodulation of a signal and having as an input a signal having a frequency within a frequency band, said signal being accepted by an antenna having a frequency related characteristic, said antenna coupled to a modifying network having gain characteristic values related to the frequencies of said frequency band and said antenna, the receiver module comprising:
   means for storing the gain characteristic values;
   means for determining which of the gain characteristic values most nearly corresponds to the frequency of said input signal and said antenna;
   means for providing a gain threshold value; and
   means for compensating said input signal when said determined gain characteristic value is greater than said gain threshold value.

* * * * *